(12) United States Patent
Vogelsang

(10) Patent No.: US 8,473,808 B2
(45) Date of Patent: Jun. 25, 2013

(54) SEMICONDUCTOR MEMORY HAVING NON-STANDARD FORM FACTOR

(75) Inventor: Thomas Vogelsang, Mountain View, CA (US)

(73) Assignee: Qimonda AG, Munich (DE)

( * ) Notice: Subject to any disclaimer, the term of this patent is extended or adjusted under 35 U.S.C. 154(b) by 630 days.

(21) Appl. No.: 12/693,837

(22) Filed: Jan. 26, 2010

(65) Prior Publication Data
US 2011/0185257 A1 Jul. 28, 2011

(51) Int. Cl.
*H03M 13/00* (2006.01)
*G11C 29/00* (2006.01)

(52) U.S. Cl.
USPC ............ 714/763; 714/758; 714/772; 714/779

(58) Field of Classification Search
USPC .......................... 714/746, 758, 763, 772, 779
See application file for complete search history.

(56) References Cited

U.S. PATENT DOCUMENTS

| | | | |
|---|---|---|---|
| 4,766,573 A | 8/1988 | Takemae | |
| 5,740,188 A | 4/1998 | Olarig | |
| 6,065,146 A | 5/2000 | Bosshart | |
| 6,125,466 A | 9/2000 | Close et al. | |
| 6,167,551 A | 12/2000 | Nguyen et al. | |
| 6,560,134 B2 | 5/2003 | Brox et al. | |
| 6,920,600 B2 * | 7/2005 | Litwin et al. | 714/784 |
| 8,122,327 B2 * | 2/2012 | Shao et al. | 714/778 |
| 2009/0204747 A1 * | 8/2009 | Lavan et al. | 711/103 |
| 2010/0042901 A1 * | 2/2010 | Moshayedi et al. | 714/773 |

OTHER PUBLICATIONS

Guiqiang Dong; Ningde Xie; Tong Zhang; , "Techniques for embracing intra-cell unbalanced bit error characteristics in MLC NAND flash memory," GLOBECOM Workshops (GC Wkshps), 2010 IEEE , vol., No., pp. 1915-1920, Dec. 6-10, 2010.*

* cited by examiner

*Primary Examiner* — Cynthia Britt
(74) *Attorney, Agent, or Firm* — Dicke, Billig & Czaja, PLLC

(57) ABSTRACT

A semiconductor memory chip including error correction circuitry configured to receive data words from an external device, each data word comprising a binary number of data bits, and configured to error encode each data word to form a corresponding coded word comprising a non-binary number of data bits including the data bits of the data word and a plurality of error correction code bits. At least one memory cell array is configured to receive and store the coded word and partitioned based on the non-binary number of bits of the coded word so as to have a non-binary number of wordlines and provide the memory chip with an aspect ratio other than a 2:1 aspect ratio.

7 Claims, 3 Drawing Sheets

SEMICONDUCTOR MEMORY HAVING NON-STANDARD FORM FACTOR

BACKGROUND

Semiconductor memories, such as dynamic random access memories (DRAM), typically employ small, regular cell units (e.g. 4 Mb) which are combined to form larger configurations, such as 64 Mb, 128, and 256 Mb configurations, for example. Additionally, DRAM memories often employ a folded bitline architecture and a cell structure commonly referred to as an 8F2-type cell, which consists of one bitline pair and one wordline, resulting in a cell area of $8F^2$, where F is the minimum feature size. Such cell characteristics, together with the page size of DRAMs which, according to industry standards (e.g. JEDEC), comprise a binary number of bits (e.g. 2k), dictate the form factor of a DRAM die employing such conventional architecture.

In many applications, it is desirable for a DRAM die to have a roughly square form factor (i.e. approximately a 1:1 aspect ratio). For example, the "ball-outs" of some standardized packages lend themselves to a square die for minimum package size (e.g. the 60 ball JEDEC package for low power DRAM), and according to the Known-Good-Die business, square DRAM dies, which fit best to a square ASIC or microprocessor die in a multi-chip package, are preferred.

DRAMs of the above-described conventional architecture having densities of 32 Mb, 128 Mb, and 512 Mb, for example, typically have a substantially square form factor (i.e. 1:1 aspect ratio). However, DRAMs having densities of 16 Mb, 64 Mb, 256 Mb, and 1 Gb, for example, typically have an aspect ratio of approximately 2:1. While a 2:1 aspect ratio can be quite easily modified to attain a 4:1 aspect ratio, a 1:1 aspect ratio is not readily achievable as the cell array would need to be delineated at a non-binary number, which conflicts with the standardized binary page size. In other cases, neither the square architecture nor a 4:1 aspect ratio (e.g. a 512 Mb array) will fit well with a given package configuration.

One technique currently employed to achieve an approximately square form factor for certain memory densities, such as 256 Mb and 1 Gb, is to partition the array into eight parts, each of which has a square form factor (e.g. 256 Mb/8=32 Mb, having a 1:1 aspect ratio). These eight parts are then arranged to form the outside blocks of a 3×3 field of blocks (e.g. a ring-like shape), with the center of the 3×3 field of blocks being used for peripheral and logic circuitry. While a roughly square form factor is achieved using this technique, chip area is wasted as the peripheral and logic circuitry does not require the full area of the center block of the field, and difficult timing conditions are created as internal data and control signal flow is different for different memory blocks.

Another technique is to employ a 6F2-type cell. However, such cell types are not compatible with all DRAM capacitor types and require major technological development for manufacturers currently using 8F2-type cells.

SUMMARY

One embodiment provides a semiconductor memory chip including error correction circuitry configured to receive data words from an external device, each data word comprising a binary number of data bits, and configured to error encode each data word to form a corresponding coded word comprising a non-binary number of data bits including the data bits of the data word and a plurality of error correction code bits. At least one memory cell array is configured to receive and store the coded word and partitioned based on the non-binary number of bits of the coded word so as to have a non-binary number of wordlines and provide the memory chip with an aspect ratio other than a 2:1 aspect ratio.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to embodiments described herein, a semiconductor memory device having a memory cell array is provided, such a DRAM memory chip, which employs a binary external page size along with on-board error correction coding to form a non-binary internal page size so that the memory array can be partitioned to provide the DRAM memory chip with a desired form having other than a substantially 2:1 aspect ratio.

Figure 1:
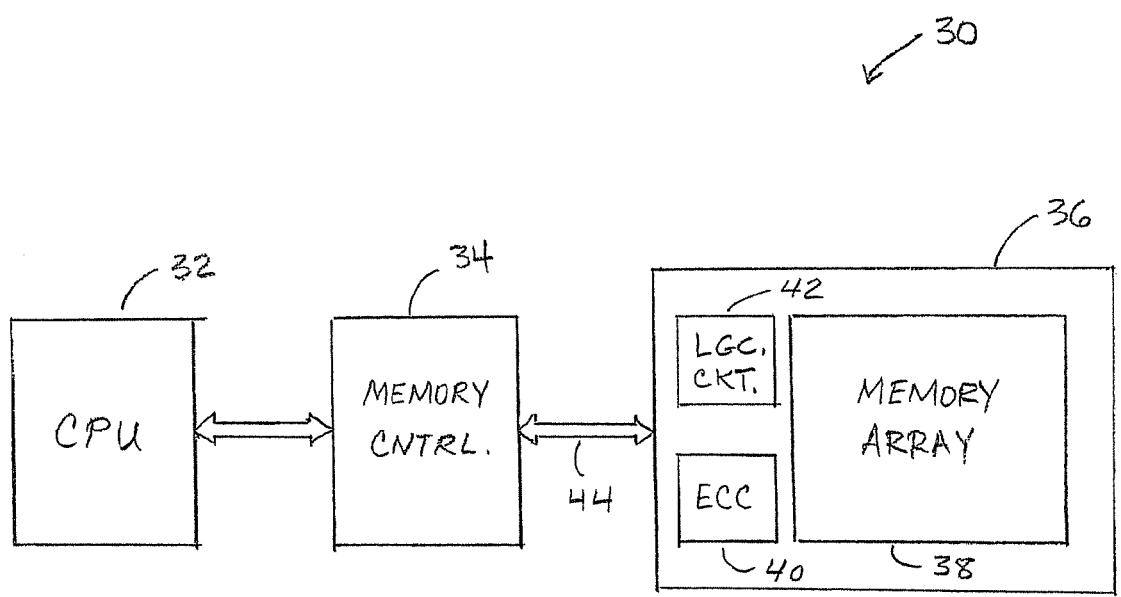
FIG. 1 is a block diagram generally illustrating a system including a memory according to one embodiment.

FIG. 1 is a block diagram generally illustrating a system 30 including a central processing unit 32, a memory controller 34, and a semiconductor memory device, such as a DRAM chip 36, according to embodiments described herein. In one embodiment, DRAM chip 36 includes a memory array 38, including sense amplifier circuitry and row and column decoding circuitry, on-chip error correction circuitry (ECC) 40, and access and logic circuitry 42, including row and column address buffers, clock circuitry, and data-in and data-out buffers, for example. In one embodiment, as described in greater detail below, memory array 38 may include a plurality of memory array blocks or banks. In one embodiment, memory array 38 employs 8F2-type memory cells.

According to one embodiment, memory controller 34 employs a binary external page size and, as such, writes and reads data words consisting of a binary number of data bits to and from DRAM chip 36 via a data and control bus 44. The term "binary" or "binary number of data bits", as employed herein, indicates that the number of data bits is a power of 2. During a write operation, for example, on-chip ECC 40 receives the data word comprising the binary number of data bits from memory controller 34, via access and logic circuitry 42, and encodes the data word to form a coded word consisting of a non-binary number of bits, with the non-binary number of bits of the coded word being greater than the binary number of data bits of the data word. The coded word is then written to or stored in memory array 38 via access and logic circuitry 42.

Similarly, during a read operation, ECC 40 receives a coded word comprising the non-binary number of bits from memory array 38 via access and logic circuitry 42 and decodes the coded word to form the corresponding data word having the binary number of bits. The decoded data word is then provided to memory controller 34 via access and logic circuitry 42 and data and control bus 44.

As described above, although employing a binary external page size, by error encoding data via on chip ECC 40, DRAM chip 36 uses a non-binary effective or internal page size. In one embodiment, ECC 40 employs a coding scheme such that the non-binary number of bits of the coded word (i.e. the coded word length) is a factor of three. In other words, according to one embodiment, DRAM chip 36 employs an external page size comprising a binary number of bits, and an effective or internal page size comprising a non-binary number of bits which is divisible by three. For example, in one embodiment, ECC 40 employs a 72/64 minimum odd-weight coding scheme which forms a 72 bit coded word to encode and correct a 64 bit data word.

As will be described in greater detail below, the non-binary number of data bits of the effective or internal page size of DRAM chip 36 enables memory array 38 to be partitioned so as to have a non-binary number of wordlines. The non-binary number of wordlines, in-turn, enables memory array 38 to employ non-standard aspect ratios which further enables DRAM chip 36 to be configured with non-standard aspect ratios (e.g. a ratio other than 2:1), even when employing 8F2-type memory cells. According to one embodiment, using the non-binary effective or internal page size resulting from ECC 40 to partition memory array 38 to achieve non-standard aspect ratios, together with the binary external page size, enables DRAM chip 36 to employ aspect ratio options similar to those available with memories employing 6F2-type memory cells.

Figure 2:
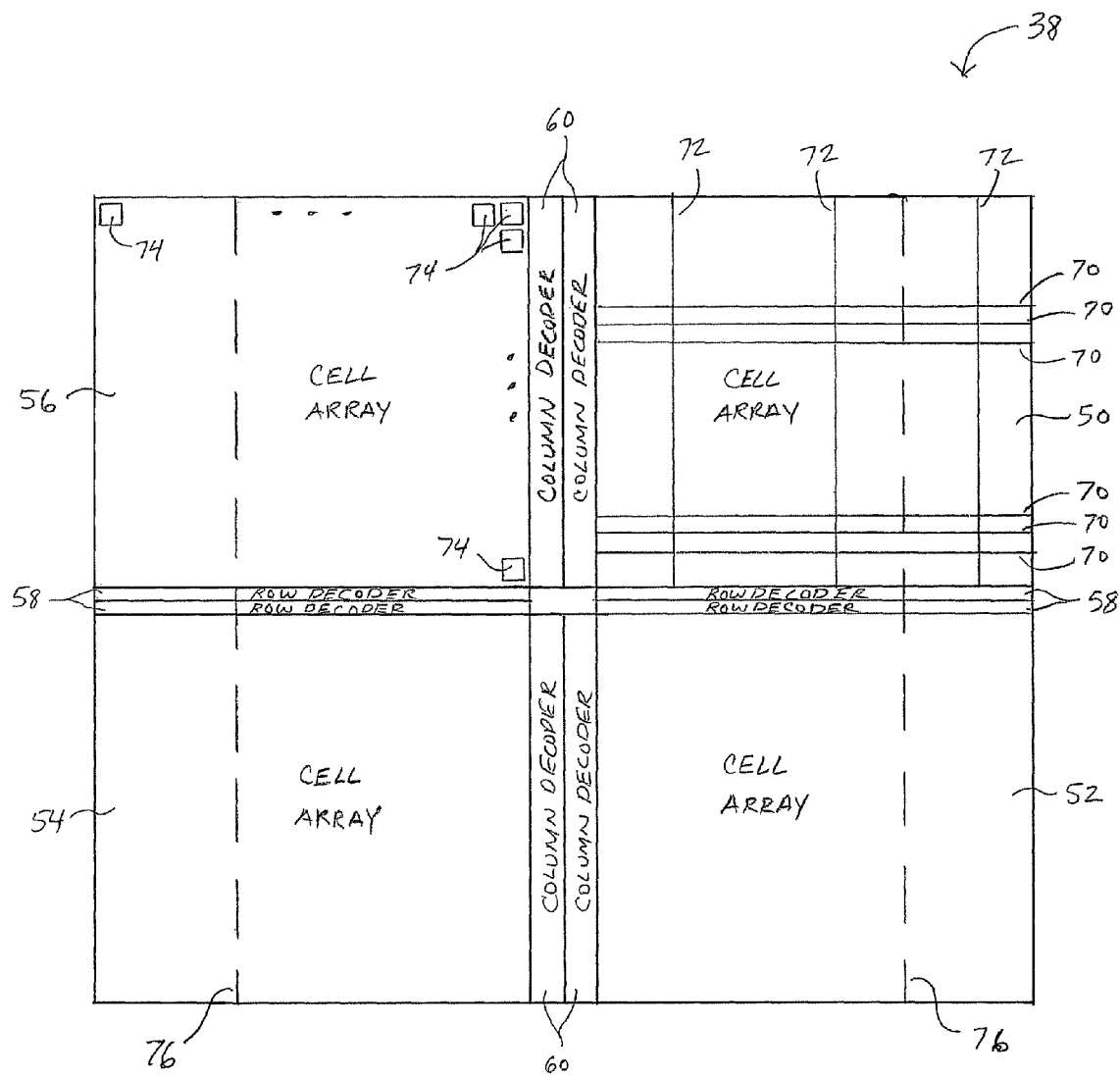
FIG. 2 is a block diagram generally illustrating a memory array according to one embodiment.

FIG. 2 is a block diagram generally illustrating one embodiment of DRAM memory array 38 employing 8F2-type cells and having a 1 Gb (1 gigabit) density. As illustrated, memory array 38 includes four memory cell arrays or banks 50, 52, 54, and 56, with each memory bank including a row decoder 58 and a column decoder 60. In one embodiment, memory banks 50, 52, 54, and 54 are arranged so that row decoders 58 of memory banks 50 and 52 are disposed along adjacent edges and row decoders 58 of memory banks 54 and 56 are disposed along adjacent edges. Additionally, column decoders 60 are disposed along adjacent edges of memory banks 50 and 56, and column decoders 60 are disposed along adjacent edges of memory banks 52 and 54.

According to the embodiment of FIG. 2, ECC 40 of DRAM chip 36 employs a 72/64 minimum odd-weight coding scheme and forms a 72 bit coded word to encode and correct a 64 bit data word, with the 72 bit coded word comprising the 64 bits of the data word and 8 ECC bits. According to such a scheme, memory cell array 38 has an effective density of 1152 Mb to store 1 Gb of data, wherein each of the four memory banks 50, 52, 54, and 56 has an effective density of 288 Mb to store 256 Mb of data (i.e. 256 Mb of data bits and 32 Mb of ECC bits).

According to the embodiment of FIG. 2, DRAM chip 36 employs an internal or effective page of a multiple of 72 bits and an external page size of a multiple of 64 bits. In one embodiment, as illustrated by FIG. 2, DRAM chip 36 employs an activation scheme wherein one memory bank is active at one time and utilizes an architecture where six (6) column select lines (CSLs) and three wordlines (WLs) are activated during an access operation to access 72 bits, with each column select line being multiplexed to four (4) bitline pairs (i.e. each bitline pair and wordline intersection of 8F2-type cell storing 1 data bit). For example, as illustrated by FIG. 2, during an access operation of cell memory block 50, six column select lines, 70, and three wordlines, 72, are activated (i.e. 6 CSLs×3 WLs×4 bit per CSL/WL intersection=72 bits).

Semiconductor memories are typically built up from regular cell array units or blocks. In one embodiment, each of the four memory banks 50, 52, 54, and 56 is built up from a plurality of cell blocks, such as illustrated by cell blocks 74 of cell array bank 56. In one embodiment, the wordlines of each memory bank 50, 52, 54, and 56 are partitioned into 36 blocks and the bitline pairs into 32 blocks, such that each memory bank 50, 52, 54, and 56 is formed by a 36×32 matrix of blocks 74, with each block 74 includes 512 wordlines and 512 bitline pairs (i.e. 18,432 WLs and 16,384 BL pairs per memory bank).

In FIG. 2, the dashed lines 76 illustrate generally example boundaries of 1-Gbit memory cell array 38 if the error control scheme of ECC 40 is not employed. By employing an error encoding scheme to achieve an internal or effective page size that enables a non-binary number of wordlines to be employed, according to embodiments described herein, memory blocks 50, 52, 54, and 56 can be partitioned so that non-standard aspect ratios can be achieved for memory array 38 and, consequently, for DRAM chip 30 as well.

Figure 3:
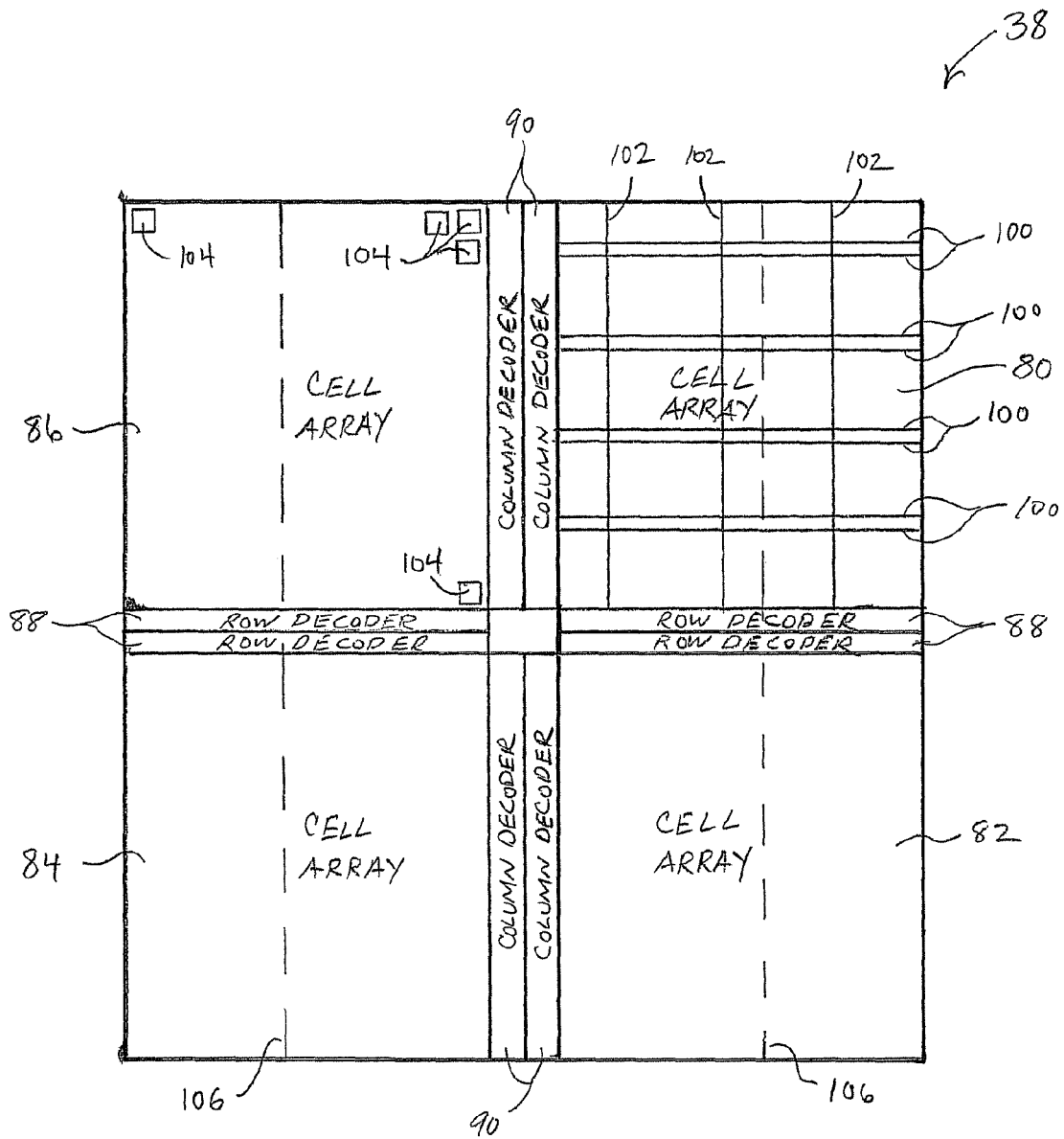
FIG. 3 is a block diagram generally illustrating a memory array according to one embodiment.

FIG. 3 is a block diagram generally illustrating one embodiment of DRAM memory array 38 employing 8F2-type cells and having a 256 Mb density. As illustrated, memory array 38 includes four memory cell arrays or banks 80, 82, 84, and 86, with each memory bank including a row decoder 88 and a column decoder 90. In one embodiment, memory banks 80, 82, 84, and 86 are arranged so that row decoders 88 of memory banks 80 and 82 are disposed along adjacent edges and row decoders 88 of memory banks 84 and 86 are disposed along adjacent edges. Additionally, column decoders 90 are disposed along adjacent edges of memory banks 80 and 86, and column decoders 90 are disposed along adjacent edges of memory banks 82 and 84.

According to the embodiment of FIG. 3, ECC 40 of DRAM chip 36 employs a 12/8 Hamming code scheme which uses 12 bits to encode and correct 8 data bits and consequently, 96 bits to encode and correct a 64-bit data word. According to such a scheme, memory cell array 38 has an effective density of 384 Mb to store 256 Mb of data, wherein each of the four memory banks 80, 82, 84, and 86 has an effective density of 96 Mb to store 64 Mb of data (i.e. 64 Mb of data bits and 32 Mb of ECC bits).

According to the embodiment of FIG. 3, DRAM chip 36 employs an internal or effective page size of multiple of 96 bits and an external page size of a multiple of 64 bits. In one embodiment, as illustrated by FIG. 2, DRAM chip 36 employs an activation scheme wherein one memory bank is active at one time and utilizes an architecture where eight (8) column select lines (CSLs) and three wordlines (WLs) are activated during an access operation to access 96 bits, with each column select line being multiplexed to four (4) bitline pairs (i.e. each bitline pair and wordline intersection of 8F2-type cell storing 1 data bit). For example, as illustrated by FIG. 3, during an access operation of memory bank 80, six column select lines, 100, and three wordlines, 102, are activated (i.e. 8 CSLs×3 WLs×4 bit per CSL/WL intersection=96 bits).

In one embodiment, each of the four memory banks 50, 52, 54, and 56 is built up from a plurality of cell blocks, such as illustrated by cell blocks 104 of cell array bank 56. In one embodiment, the wordlines of each memory bank 80, 82, 84, and 86 are partitioned into 24 blocks and the bitline pairs into 16 blocks, such that each memory bank 80, 82, 84, and 86 is formed by a 24×16 matrix of blocks 104, with each block 104 including 512 wordlines and 512 bitline pairs (i.e. 12,288 WLs and 8,192 BL pairs per memory bank).

In FIG. 3, the dashed lines 106 illustrate generally example boundaries of 256 Mbit memory cell array 38 if the error control scheme of ECC 40 is not employed. By employing an error encoding scheme to achieve an internal or effective page size that enables a non-binary number of wordlines to be employed, according to embodiments described herein, memory blocks 80, 82, 84, and 86 can be partitioned so that non-standard aspect ratios can be achieved for memory array 38 and, consequently, for DRAM chip 30 as well.

Although described herein primarily with regard to a DRAM employing 8F2-type memory cells, it is noted that teachings of the embodiments described herein can be applied to DRAMs employing memory cells of other types as well.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory chip comprising:
    error correction circuitry configured to receive data words from an external device, each data word comprising a binary number of data bits, and configured to error encode each data word to form a corresponding coded word comprising a non-binary number of data bits including the data bits of the data word and a plurality of error correction code bits; and
    at least one memory cell array configured to receive and store the coded word and partitioned based on the non-binary number of bits of the coded word so as to have a non-binary number of wordlines and provide the memory chip with an aspect ratio other than a 2:1 aspect ratio.

2. The memory chip of claim 1, wherein the memory chip comprises a DRAM memory and the memory cell array comprises 8f2-type memory cells.

3. The memory chip of claim 1, wherein the code words comprise a non-binary number of bits of which is a factor of three.

4. The memory chip of claim 1, wherein the error correction circuitry employs a minimum odd weight code scheme to encode 64 data bits as a 74-bit coded word.

5. The memory chip of claim 1, wherein the error correction circuitry employs a 12/8 Hamming code scheme to encode 64 data bits as eight, 12-bit coded words.

6. A semiconductor memory chip comprising:
    error correction circuitry configured to receive data words from an external device, each data word comprising a binary number of data bits, and configured to error encode each data word to form a corresponding coded word comprising a non-binary number of data bits including the data bits of the data word and a plurality of error correction code bits; and
    at least one memory cell array configured to receive and store the coded word and partitioned based on the non-binary number of bits of the coded word so as to have a non-binary number of wordlines and provide the memory chip with an aspect ratio other than a 2:1 aspect ratio, wherein the error correction circuitry employs a minimum odd weight code scheme to encode 64 data bits as a 74-bit coded word, and wherein the at least one memory cell array comprises four memory cell array blocks, each block having an effective density of 288 Mbits with the four memory cell array blocks together providing an effective density of 1152 Mbits and a data storage density of 1024 Mbits, and wherein the four memory cell array blocks are arranged so as to provide the memory chip with a form factor having substantially a 1:1 aspect ratio.

7. A semiconductor memory chip comprising:
    error correction circuitry configured to receive data words from an external device, each data word comprising a binary number of data bits and configured to error encode each data word to form a corresponding coded word comprising a non-binary number of data bits including the data bits of the data word and a plurality of error correction code bits; and
    at least one memory cell array configured to receive and store the coded word and partitioned based on the non-binary number of bits of the coded word so as to have a non-binary number of wordlines and provide the memory chip with an aspect ratio other than a 2:1 aspect ratio, wherein the error correction circuitry employs a 12/8 Hamming code scheme to encode 64 data bits as eight, 12-bit coded words, and wherein the at least one memory cell array comprises four memory cell array blocks, each block having an effective density of 96 Mbits with the four memory cell array blocks together providing an effective density of 384 Mbits and a data storage density of 256 Mbits, and wherein the four memory cell array blocks are arranged so as to provide the memory chip with a form factor having substantially a 1:1 aspect ratio.

* * * * *